US006689952B2

(12) United States Patent
Kawaguchi

(10) Patent No.: US 6,689,952 B2
(45) Date of Patent: Feb. 10, 2004

(54) LARGE MEMBRANE SPACE STRUCTURE AND METHOD FOR ITS DEPLOYMENT AND EXPANSION

(75) Inventor: Junichiro Kawaguchi, Sagamihara (JP)

(73) Assignee: The Director-General of the Institute of Space and Astronautical Science, Sagamihara (JP)

( * ) Notice: Subject to any disclaimer, the term of this patent is extended or adjusted under 35 U.S.C. 154(b) by 24 days.

(21) Appl. No.: 10/014,346

(22) Filed: Dec. 14, 2001

(65) Prior Publication Data

US 2003/0010869 A1 Jan. 16, 2003

(30) Foreign Application Priority Data

Jul. 16, 2001 (JP) ....................................... 2001-215823

(51) Int. Cl.[7] .......................... H01L 31/045; B64G 1/40

(52) U.S. Cl. ....................... 136/292; 136/244; 136/245; 244/168; 244/173; 114/102.29; 114/102.32; 290/1 R

(58) Field of Search ................................ 136/244, 245, 136/292; 244/168, 173; 114/102.29, 102.32; 290/1 R

(56) References Cited

U.S. PATENT DOCUMENTS

| | | | | | |
|---|---|---|---|---|---|
| 4,614,319 | A | * | 9/1986 | Drexler ...................... | 244/172 |
| 5,296,044 | A | * | 3/1994 | Harvey et al. .............. | 136/245 |
| 5,642,122 | A | | 6/1997 | Lockie et al. ............... | 343/881 |
| 6,194,790 | B1 | * | 2/2001 | Griffin et al. ............... | 290/1 R |

FOREIGN PATENT DOCUMENTS

| | | | | |
|---|---|---|---|---|
| EP | 399055 | A1 | * | 11/1990 |
| JP | 1-275300 | A | * | 11/1989 |
| RU | 1758988 | | | 8/1995 |
| RU | 2053941 | | | 2/1996 |

OTHER PUBLICATIONS

Derwent abstract No. 1996–453758, Feb. 1996.*

"Build Your Own Cosmos–1 Solar Sail Spacecraft Scale Model," http://www.spacecraftkits.com, updated Dec. 2001.*

C.E. Gerner, JPL, vol. 7, pp. 447–457, XP–010517976, "Large Area Sail Design Concepts", Mar. 18, 2000.

* cited by examiner

*Primary Examiner*—Alan Diamond
(74) *Attorney, Agent, or Firm*—Oblon, Spivak, McClelland, Maier & Neustadt, P.C.

(57) ABSTRACT

A large membrane space structure deployed and spanned by centrifugal force owing to the spin motion, contains a hub located at a central portion thereof and a sail including a plurality of petals attached to the hub by supports. Each of the petals has regions symmetrical to an imaginary center line passing through the center of the hub. Membranes are spanned on the regions. Each of the membranes is divided into parts of suitable shapes, and adjacent membranes are discretely connected to each other by bridge belts to suppress the residual crease strain. The petals are symmetric with respect to the center of the hub. Deployment force is provided in the circumferential direction by the introduction of imaginary tension lines. The petals may be connected to each other to help deployment.

20 Claims, 5 Drawing Sheets

LARGE MEMBRANE SPACE STRUCTURE AND METHOD FOR ITS DEPLOYMENT AND EXPANSION

CROSS-REFERENCE TO RELATED APPLICATIONS

This application is based upon and claims the benefit of priority from the prior Japanese Patent Application No. 2001-215823, filed Jul. 16, 2001, the entire contents of which are incorporated herein by reference.

BACKGROUND OF THE INVENTION

1. Field of the Invention

The present invention relates to a large membrane space structure mounted on a spacecraft or space vehicle, and a method for its deployment and expansion.

2. Description of the Related Art

A large membrane space structure means a large membrane structure for use in space, such as a large solar cell module used for obtaining power in space, or a solar sail or photon sail used as a propulsion system in space.

In recent years, there has been an increased demand for exploration of the solar system. A spacecraft such as a so-called rocket, which is propelled by a reaction of high-speed exhaust of combustion gas, can only be loaded with a limited amount of propellant or fuel. Therefore, the search for a new propulsive system that does not need propellant or fuel has been of great interest. Accordingly, the development of a large membrane space structure, such as a solar sail propelled by the reflection of solar radiation, has been strongly investigated.

The large membrane space structure includes a sail to which a membrane is adhered. Aluminum is sputtered onto the membrane and made specula. The sail is deployed and spanned by the centrifugal force owing to a spacecraft or an artificial satellite spin motion. As shown in FIG. 5, the sail 14 reflects solar radiation on the membrane and provides thrust F to a spacecraft or an artificial satellite by means of the reaction caused by light reflection. Some of the large membrane space structures of a practical scale have a rectilinear shape, each side of which may be as long as several tens of meters to a few hundred meters or longer. Accordingly, the membrane is also as large as the structure.

Even the large membrane space structure travels in space where solar gravity acts. Since the light pressure acceleration that acts on the sail 14 is much smaller than the gravity of the sun or the earth, it moves mainly governed by the gravity rather than the thrust F due to the light pressure. More specifically, as shown in FIG. 6, in the solar system, even the large membrane space structure orbits like a planet around the sun. Near the earth, it may orbit around the earth as an artificial satellite.

The thrust F generated by the sail 14 has the function of accelerating or decelerating the orbital motion, or applying acceleration to the space structure in order to change the orbit. When the large membrane space structure starts orbital motion in space, since the acceleration and deceleration are very small, the space structure is gradually accelerated and decelerated.

Referring back to FIG. 5, the thrust F on the planar large membrane space structure where area is A is represented by the following equation:

$$F=PA(1+r)\cos\theta$$

where P represents the light pressure of solar radiation per unit area, r represents the light reflectivity of the sail, and θ represents the incident angle spanned by the normal direction of a membrane surface with the direction toward the sun. Since F depends on the steering angle θ, if it is assumed that θ=0° and r=1 that means perfect reflection, the thrust F is represented by the following equation:

$$F=2PA(N/m^2).$$

Near the earth, the light pressure P of the solar radiation is very low, i.e., $P\approx 4.6\times 10^{-6}N/m^2$. The performance of the large membrane space structure depend on the acceleration. Assuming that the sail 14 is formed of a membrane of an areal density of β ($kg/m^2$), the mass is represented by βA. If βis 0.01 $kg/m^2$, the acceleration α is represented by the following equation:

$$\alpha=2P/\beta\approx 9.2\times 10^{-4}m/s^2.$$

This is as substantial as the acceleration of an ion engine or a plasma engine.

The acceleration of a large membrane space structure increases with the flight time. Therefore, the more the flight time lingers for the travel, the more advantageous the large membrane space structure is over the chemical engine consuming propellant or fuel.

As shown in FIG. 7, a conventional type of large membrane space structure is rectilinear. The large membrane space structure comprises four spars 32 to spread a sail 30. One end of each spar 32 is supported by a center hub 34. The hub 34 includes a payload and a mechanism for expanding the spars 32 (both are not shown). The attitude of the large membrane space structure may be controlled by the torque generated by tip vanes 36 attached to the tips of the spars 32. The torque may be generated by shifting the center of the pressure of the solar radiation from the mass center of the structure.

When the sail 30 is transported into space, the membrane is folded suitably and may be wrapped around a core material such as a cylindrical pipe, so that it can be packed compactly.

To pack a large membrane space structure having rectilinear membranes, the membranes may be folded and wrapped after the huge sail is produced. However, it is difficult and not practical to carry out this method in a structure of practical scale.

In addition, since the membrane itself is folded and creased, residual stress and strain may be generated and left in the membrane. To smooth out such a fold, a certain spreading force is required. Therefore, the fold is the most crucial factor that prevents the sail from being deployed in space. Otherwise, since a number of complex structures are required to deploy the sail, the deployment may even be unsuccessful.

Moreover, the sail of the large membrane space structure may require an outer frame. For example, it is sometimes assumed that framework members, such as expandable spars, are used to spread the sail. Since the framework members must be very large and stiff, the mass thereof cannot be reduced easily. Therefore, this may result in the considerably large vehicle required to transport the large membrane space structure into space.

Furthermore, in the large membrane space structure made of a single sail, since the amount of torque applied to the very large structure cannot be controlled easily, it is difficult to adjust the rotation speed of the spacecraft.

BRIEF SUMMARY OF THE INVENTION

The present invention was devised to solve the above problems, and an object thereof is to provide a large membrane space structure and a method for its deployment and expansion.

To solve the above problems, according to an aspect of the present invention, there is provided a large membrane space structure mounted on a spacecraft comprising:

a) a hub including:
   - a plurality of supports, with a first imaginary fulcrum at the center of the hub, a first support member which is stiff, a second support member which is a beam structure that may be hinged on at least a midpoint thereof, and first rigging connecting ends of the first and second support members as well as the hub; and
   - control means for deflecting the supports at desired angles with respect to the spacecraft by rotating them about an imaginary center line extending through the first fulcrum and the midpoint of the second support member as a pivotal member; and b) a sail including petals that are symmetrical with respect to the first fulcrum when deployed and attached to the supports, each petal including:
   - membranes spanned on first regions symmetric with respect to the imaginary center line and including the first fulcrum, a second fulcrum located on the imaginary center line and separated from the first fulcrum, and two points symmetric with respect to the imaginary center line, the membranes spanned on second regions defined by a peripheral portion of the first region opposite to the second fulcrum and a plurality of split lines extending from the second fulcrum to the peripheral portion at arbitral intervals; and
   - bridge belts along the split lines to the peripheral portion discretely connecting the membrane elements to one another at intersections between split lines and a plurality of imaginary lines extending from an end of the second support member to an end portion of an outermost membrane elements opposite to the first fulcrum, the bridge belts providing tension across the membranes.

According to another aspect of the present invention, there is provided a method for deploying and spanning the large membrane space structure recited in claim 1, in which the petal has folds in the bridge belts, and which is folded such that adjacent membranes are faced each other, and is wrapped and packed around the hub, the method comprising:

- rotating the petal in a predetermined direction about the first supporting point;
- extending first the petal radially from the hub by centrifugal force generated in radial directions perpendicular to a direction of rotation of the petal, thereby unwrapping the membrane elements from the hub by tension generated in the radial directions while the membrane members are folded at bridge lines, and rotating the support and the petal about the imaginary center line at a desired angle; and
- unfolding the folds by tension acting on the bridge belts by the centrifugal force, and deployment force in the circumferential direction of the petal generated by both the centrifugal force and tension supporting lines extending from the end of the second support member at certain obliged angles with respect to a radial direction of the centrifugal force, thereby deploying the membrane elements.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention will be described with reference to FIGS. 1 to 4.

First, a structure of a large membrane space structure, which serves as a propulsion component, will be described.

Figure 1:
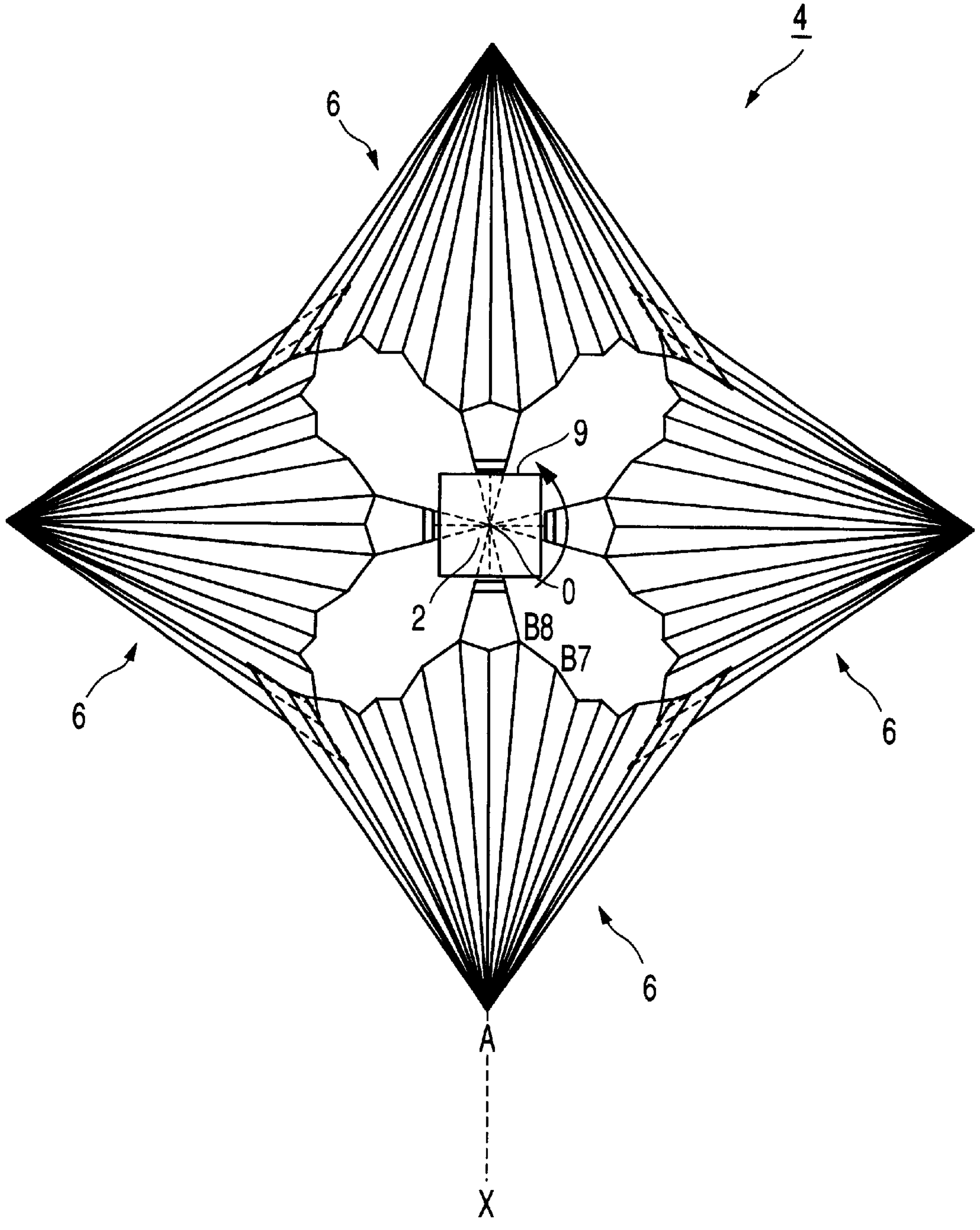
FIG. 1 is a schematic diagram showing a large membrane space structure with petals of the sail half-opened according to an embodiment of the present invention.
Figure 2:
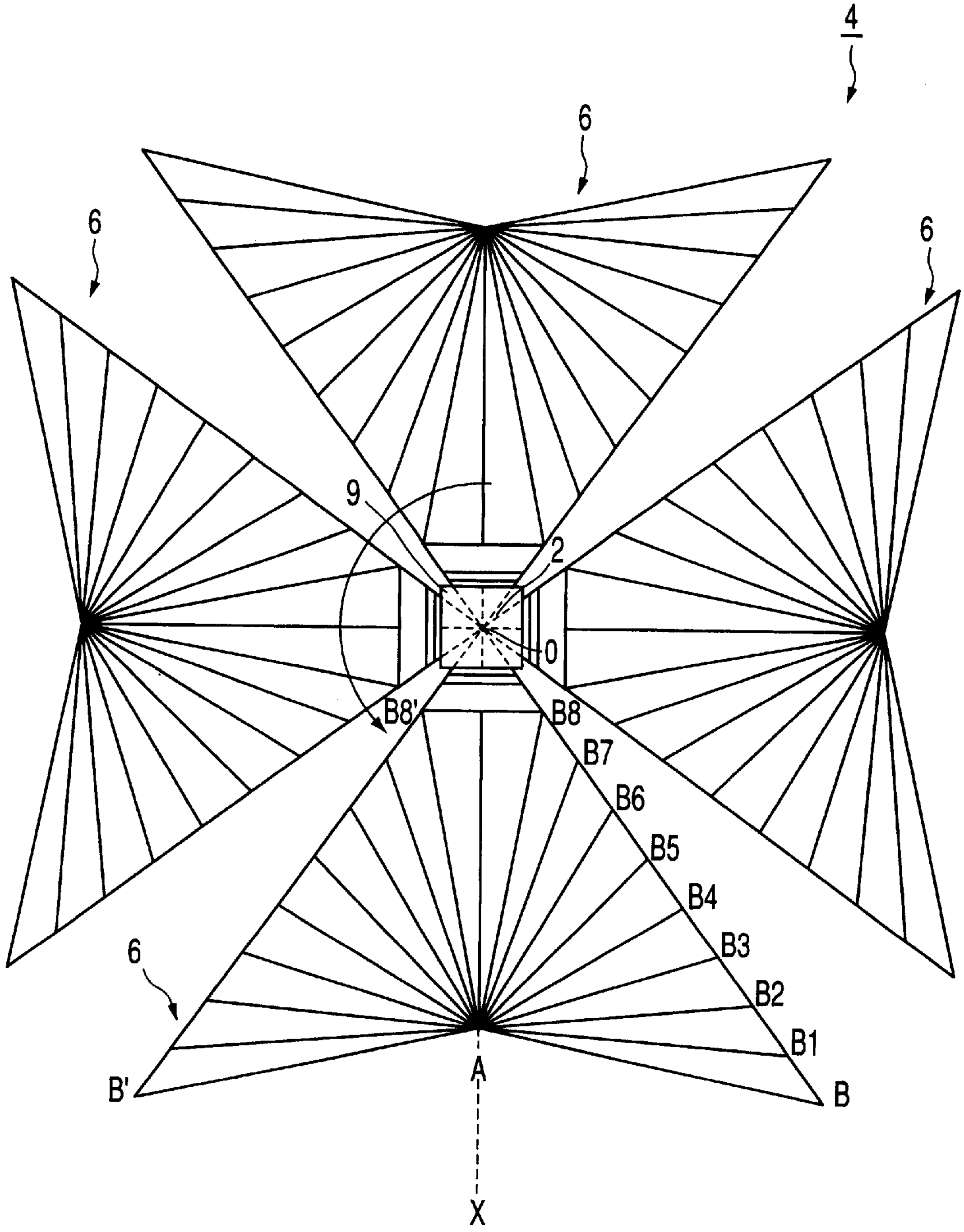
FIG. 2 is a schematic diagram showing an example of a large membrane space structure with petals of the sail full-opened according to an embodiment of the present invention.

As shown in FIGS. 1 and 2, a large membrane space structure includes a hub 2 mounted on a spacecraft and a sail 4 having, for example, four petals 6. The hub 2 includes supports 8, which serve as connecting members to connect the hub 2 with the respective petals 6. Each support 8 includes a first support member 8*a* having stiffness, and a second support member 8*b*, which has a cord or beam structure hinged on at least a midpoint M. In this embodiment, it is assumed that the second support member 8*b* is beamed only at the midpoint M. The ends $B_9$ and $B_9'$ of the first support member 8*a* are respectively connected to the ends $B_8$ and $B_{8'}$ of the second support member 8*b* by first rigging ($B_9B_8$ and $B_9'B_8'$). The first rigging is, for example, a long, durable hard-to-cut cord. Each support 8 is deflectable relative to an imaginary center line OX to be described later. It includes control means 9 for controlling the angle of deflection to a desired angle within a predetermined range.

The petals 6, having the same rectilinear shape OBAB', are spread symmetrically with respect to the center of the hub 2, as shown in FIG. 2. One of the apexes of the rectilinear part OBAB' that coincides with the center of hub 2 is referred to as a first fulcrum O. Each of the petals 6 has a shape symmetric with respect to the imaginary center line OX to be described later.

Since the petals 6 have the same shape and are symmetric with respect to the first fulcrum O, only one petal 6 will be described below.

Figure 3:
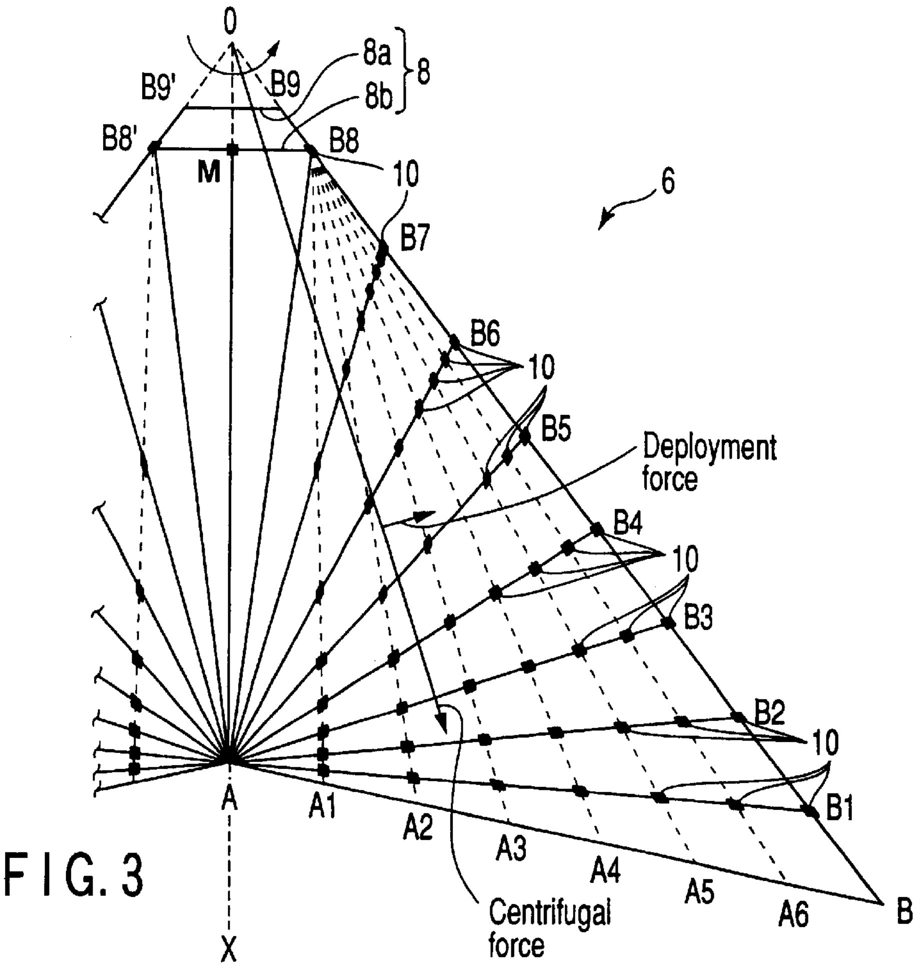
FIG. 3 is a schematic diagram showing an example of a part of a petal according to the embodiment of the present invention.
Figure 5:
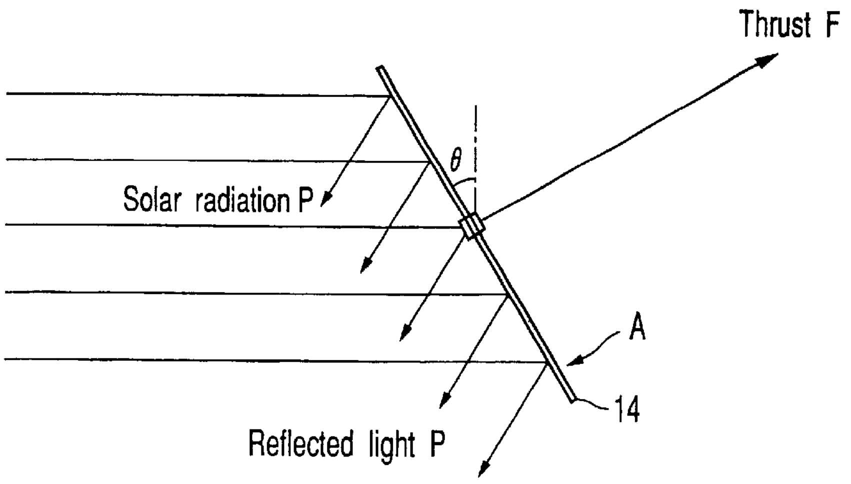
FIG. 5 is a schematic diagram for explaining that a large membrane space structure is given thrust in a desired direction upon receipt of a light pressure by solar radiation.

As shown in FIG. 3, a line passing through the first fulcrum O and the midpoint M of the second support member 8*b* is called an imaginary center line segment. A second fulcrum A is located at an end of the imaginary center line segment opposite to the first fulcrum O. A semi-infinite line passing through the first fulcrum O and the second fulcrum A is referred to as an imaginary center line OX. As described above, the petal 6 is symmetric with respect to the imaginary center line OX and comprises, for example, two triangular parts OAB and OAB'. The triangular parts OAB and OAB' are referred to as first regions. The line segments OA on the imaginary center line OX and the sides AB and AB' are, for example, 50 m long.

For example, eight split lines $AB_1$ to $AB_8$ and eight split lines $AB_1$' to $AB_8$' are imaginarily drawn from the second fulcrum A to sides OB and OB' at appropriate intervals.

Since the first regions ABO and AB'O are symmetric with respect to the imaginary center line OX, only one triangular part ABO of the first region will be described in the following.

As shown in FIG. 3, the triangular part ABO of the first region is divided into nine triangular parts $ABB_1$, . . . $AB_1B_2$, $AB_7B_8$ and $AB_8O$ by the split lines $AB_1$ to $AB_8$. Of the nine triangular parts, the parts $ABB_1$, $AB_1B_2$, . . . and $AB_7B_8$ are referred to as second regions. Membranes $ABB_1$, $AB_1B_2$, . . . and $AB_7B_8$ having the shapes corresponding to the triangular parts $ABB_1$, $AB_1B_2$, . . . and $AB_7B_8$ are connected to the respective second regions. The membranes $ABB_1$, $AB_1B_2$, . . . and $AB_7B_8$ are preferably formed of a polymeric material resistant to space environment, such as polyimide material. It is preferable that a membrane $AB_8M$, formed of the polymeric material resistant to space environment and having the shape corresponding to a triangular part $AB_8M$ within the triangle $AB_8O$, be adhered to the triangular part $AB_8M$ defined by the line segment OA on the imaginary center line OX, the split line $AB_8$ nearest to the imaginary center line and the second support member 8*b*. Thus, one of the apexes of each membrane is supported by the second fulcrum A. Second rigging may be extended along a side $B_8B$. The membranes $ABB_1$, $AB_1B_2$, . . . and $AB_7B_8$ are connected to one another at the ends $B_7$, $B_6$, . . . and $B_1$ by bridge belts 10.

The areal density of the membranes $ABB_1$, $AB_1B_2$, . . . $AB_7B_8$ and $AB_8M$ is, for example, about 30 g/m$^2$ or less. For example, aluminum is sputtered on the membranes $ABB_1$, $AB_1B_2$, . . . $AB_7B_8$ and $AB_8M$ and makes them speculate. Therefore, the membranes $ABB_1$, $AB_1B_2$, . . . $AB_7B_8$ and $AB_8M$ reflect the solar radiation at high reflectivity. The mass increase due to sputtering of the membranes $ABB_1$, $AB_1B_2$, . . . $AB_7B_8$ and $AB_8M$ is negligible.

The intersection between the membrane $AB_7B_8$ and the second support member 8*b*, i.e., the point $B_8$ is referred to as the third fulcrum. For example, six imaginary lines $B_8A_1$, $B_8A_2$, . . . and $B_8A_6$ are drawn from the third fulcrum $B_8$ to the opposite side AB at suitable intervals.

As shown in FIG. 3, bridge belts 10 are arranged at the intersections between the imaginary lines $B_8A_1$, $B_8A_2$, . . . and $B_8A_6$ and membranes $ABB_1$, $AB_1B_2$, . . . and $AB_7B_8$, so that the adjacent members are discretely welded or adhered to each another. It is preferable that the bridge belts 10 as well as the membranes are formed of a polymeric material resistant to space environment, such as polyimide material.

The large membrane space structure of this embodiment is very light, since it comprises almost only the membranes as described above.

A plurality of peripheral weights (not shown) can be attached to an outer side AB of the membrane $ABB_1$ and/or the second rigging $B_8B$ (peripheral portion) at suitable intervals. In the following description, it is assumed that peripheral weights are attached to the outer side AB only. Details of the peripheral weights will be described later.

A process of producing and packing the aforementioned large membrane space structure will be described.

First, membranes having the shapes corresponding to the triangular parts $ABB_1$, $AB_1B_2$, . . . $AB_7B_8$ and $AB_8M$ are prepared. Then, the triangle membranes are overlaid one on another so that they can be in a packing state. In this state, the membrane surfaces face each other. The bridge belts 10 are arranged at the predetermined positions as mentioned above and the membranes are welded and/or adhered by using the bridge belts 10. Preferably, the bridge belts 10 are arranged such that the folds can be as small as possible. It is preferable that the bridge belts 10 have a width of several centimeters to several tens of centimeters and the length of several tens of centimeters to about one meter. Thus, the bridge belts 10 are sufficiently smaller than the membranes $ABB_1$, $AB_1B_2$, . . . $AB_7B_8$ and $AB_8M$. The apexes $B_8$, $B_7$, . . . and $B_1$ of the membranes are connected by the bridge belts 10. As described before, the second rigging may be extended along the side $B_8B$. The petal 6 is attached to the support 8.

The apexes B, $B_1$, . . . and $B_8$ of the membranes $ABB_1$, $AB_1B_2$ . . . and $AB_7B_8$ are temporarily connected together. The connected membranes are wrapped around the hub 2 (spacecraft) and packed compactly.

Thus, the adjacent membranes are connected by the bridge belts 10 between the membranes $ABB_1$, $AB_1B_2$, . . . $AB_7B_8$ and $AB_8M$, only the belts 10 are folded and no folds are formed in the membranes themselves. In addition, since the membranes are overlaid one on another, the petal 6 can be packed upon completion of welding and/or adhesion of the bridge belts 10 to the adjacent membranes. Therefore, a small space that can contain one or two membranes is sufficient to produce and pack one petal 6. In other words, the petal 6 can be produced and packed more efficiently as compared to the case where all membranes are arranged at predetermined positions and adhered to one another by bridge belts 10 at predetermined positions, and the petal 6 is folded at split lines $AB_1$ to $AB_8$ and $AB_1$' to $AB_8$'. Moreover, the folded petal 6 can be spread with much smaller force as compared to the case where the membranes themselves are folded and the petal 6 is spread by releasing the residual stress and strain of the folded portions of the membranes. In other words, the residual stress and strain involved in spreading the large membrane structure are limited to the width of the bridge belt 10. Therefore, the above structure is easily spread.

A process of deployment (and expansion) spreading the large membrane space structure in space will now be described.

First, the packed large membrane space structure is transported into space. The structure is rotated about the hub 2 at a suitable rotation speed in a direction (circumferential direction of rotation) in which the petals 6 are wrapped around the hub 2, thereby generating centrifugal force in a direction perpendicular to the circumferential direction of rotation by virtue of the function of peripheral weights. The petals 6 are gradually unwrapped from the hub 2 by the tension of the membranes generated in the directions of centrifugal force of the respective petals 6, and extended radially outward from the hub 2.

The temporary connection of the apexes B, $B_1$, . . . and $B_8$ of the membranes $ABB_1$, $AB_1B_2$ . . . and $AB_7B_8$ are released.

Since the membranes $ABB_1$, $AB_1B_2$, . . . and $AB_7B_8$ are wrapped around the spacecraft, they may suffer from some warping in the longitudinal direction due to a core set. Since the core set of the membranes in the direction perpendicular to the longitudinal direction is negligible, it need not be taken into consideration.

When the petals 6 are rotated and spread, around the bridge belts 10 connecting the outermost membrane $ABB_1$ and the adjacent membrane $AB_1B_2$, the centrifugal force acting in the radial direction, in which the petal 6 is spread, balances the force acting in the circumferential direction of rotation. Therefore, the centrifugal force due to the rotation gives tension across the membranes and the bridge belts 10. The tension acts in the direction in which the residual stress and strain of the folds of the bridge belts 10 connecting the membranes and the core set in the membranes are released.

Then, the support 8 mounted on the hub 2 is controlled to rotate the petal 6 about the imaginary center line OX at an arbitrary angle, preferably between 45° and 60°. If the four petals 6 are spread simultaneously on the same plane as shown in FIG. 1, the adjacent petals 6 will be brought into contact with each other. To avoid this, the supports 8 are controlled by the control means 9 to rotate the petals 6, preferably at the same angle, so that the petals 6 can be substantially parallel to one another.

Thereafter, the sail 4 is rotated about the first fulcrum around the hub 2 in the direction of the arrow shown in FIGS. 1, 2 and 3 at the speed of, for example, 4 rpm. The peripheral weights mentioned above generate centrifugal force in the radial directions perpendicular to the circumferential direction of rotation. The point $B_8'$ symmetric to the third fulcrum $B_8$ with respect to the imaginary center line OX is referred to as the fourth fulcrum.

Weak compression force, which acts in the direction of closing the petal 6, may be applied across the second support members $B_8M$ and $MB_8'$. When the petal 6 is rotated, the centrifugal force acting on the center of the hub 2 is virtually offset by the force acting on the third and fourth fulcrums $B_8$ and $B_8'$. Therefore, deploying force of the membranes is applied also in the circumferential direction of rotation by tension supporting lines, namely the imaginary lines $B_8A_1$, $B_8A_2$, . . . and $B_8A_6$ ($B_8'A_1'$, $B_8'A_2'$, . . . and $B_8'A_6'$) extending from the third fulcrum $B_8$ (the fourth fulcrum $B_8'$) at angles with respect to the radial directions. Thus, the petal 6 can be deployed.

As described before, the peripheral weights are provided on the outer side AB. In the case where the rotation speed of the spacecraft is 4 rpm and the distance between the points O and A is about 50 m, the weight necessary to provide force equivalent to the membrane's own weight on the earth to exert on the points A, $A_1$, . . . , $A_6$ and B on the outer side AB is about 0.1 kg per meter. Accordingly, in the case where the end side AB of the sail 4 is about 50 m, since the total length of all end sides is about 400 m, the peripheral weights of about 40 kg must be attached to the end sides. In this state, the force for spreading the petal 6 is equivalent to the force generated by suspending the petal 6 under the gravity 1 G on the earth. The peripheral weights are not limited to the weights as described above, but can be varied in accordance with the design of the large membrane space structure.

The bridge belts 10 connecting the membranes are located on the imaginary lines extending from the third and fourth fulcrums $B_8$ and $B_8'$ at arbitrary angles smaller than the angle AOB. They can provide deployment force not only in the radial directions in which the centrifugal force acts but also in the circumferential direction of rotation. In other words, since imaginary angles $AB_8A_1$, $A_1B_8A_2$, . . . and $A_6B_8B$ are smaller than the angle AOB, deploying force for the petal 6 is exerted on the bridge belts 10 on the imaginary lines $B_8A_1$, $B_8A_2$, . . . and $B_8A_6$.

The force necessary to deploy the petal 6 is the smallest at the end side AB. Therefore, if the outermost membrane $ABB_1$ is deployed, it is ensured that all the membranes of the petal 6 can be deployed.

Since the rotation speed of the sail is gradually reduced as the petal 6 is deployed, the petals 6 is deployed passively.

Thus, the centrifugal force by the rotation can be supplemented by the peripheral weights, and the membranes and bridge belts 10 receive not only the centrifugal force but also the deployment force in the direction perpendicular to the direction of the centrifugal force. Therefore, the force sufficient to deploy the petal 6 can be given to the petal 6.

In this embodiment, the peripheral weights are attached to the end side AB to deploy the large membrane space structure. However, depending on the design of the structure or the density of the membrane, the peripheral weights may be provided on the peripheral portion $B_8B$, or no weights may be provided on the end side AB or the peripheral portion $B_8B$.

The attitude of the large membrane space structure is changed by setting its center of mass off the center of the light pressure of solar radiation. When the large membrane space structure is rotated at a high speed, the membranes can be deployed more easily, but the amount of offset of the center of gravity, which is determined by request for change of the attitude, is increased. Therefore, it is necessary to avoid excessively high-speed rotation.

The peripheral weights of the large membrane space structure can be lightened by increasing the rotation speed. In this case, however, a larger amount of chemical propellant is required to rotate the structure. Therefore, it is necessary to determine whether the rotation speed should be increased by using the fuel of the large membrane space structure. The amount of fuel required for rotation is increased in proportion to the rotation speed, while the peripheral weights can be reduced in proportion to the reciprocal of the square of the rotation speed.

For example, in the case of a bipropellant system using hydrazine and nitrogen tetroxide, to increase the rotation speed of the spacecraft having a mass of about 500 kg from 0 rpm to 4 rpm, if the density of the membrane is about 30 $g/m^2$ or less and sides BA and AB' and the line segment OA on the imaginary center line OX of the sail 4 are about 50 m, the fuel of about 40 kg is required. Thus, a large part of the fuel loaded in the spacecraft may be used to increase the rotation speed. The off-center quantity necessary to change the attitude of the spacecraft by 3° a day is about 60 cm. Naturally, if the membrane density is smaller, the weight of the spacecraft in its entirety and the required amount of fuel can be less.

After the petal 6 is spread, the supports 8 are controlled again using the control means 9 to deflect the four petals 6 at arbitrary angles. A desired amount of torque is generated in accordance with the rotation angles of the petals 6 with respect to the light pressure, thereby performing attitude control and adjusting the torque of the component of the light pressure applied to the sail 4 in the circumferential direction of the rotation.

In this embodiment, the sides BA and AB' and the imaginary center line segment OA are about 50 m long. However, the lengths are not limited to 50 m but may be within the range of several tens to several hundreds of meters.

Figure 4:
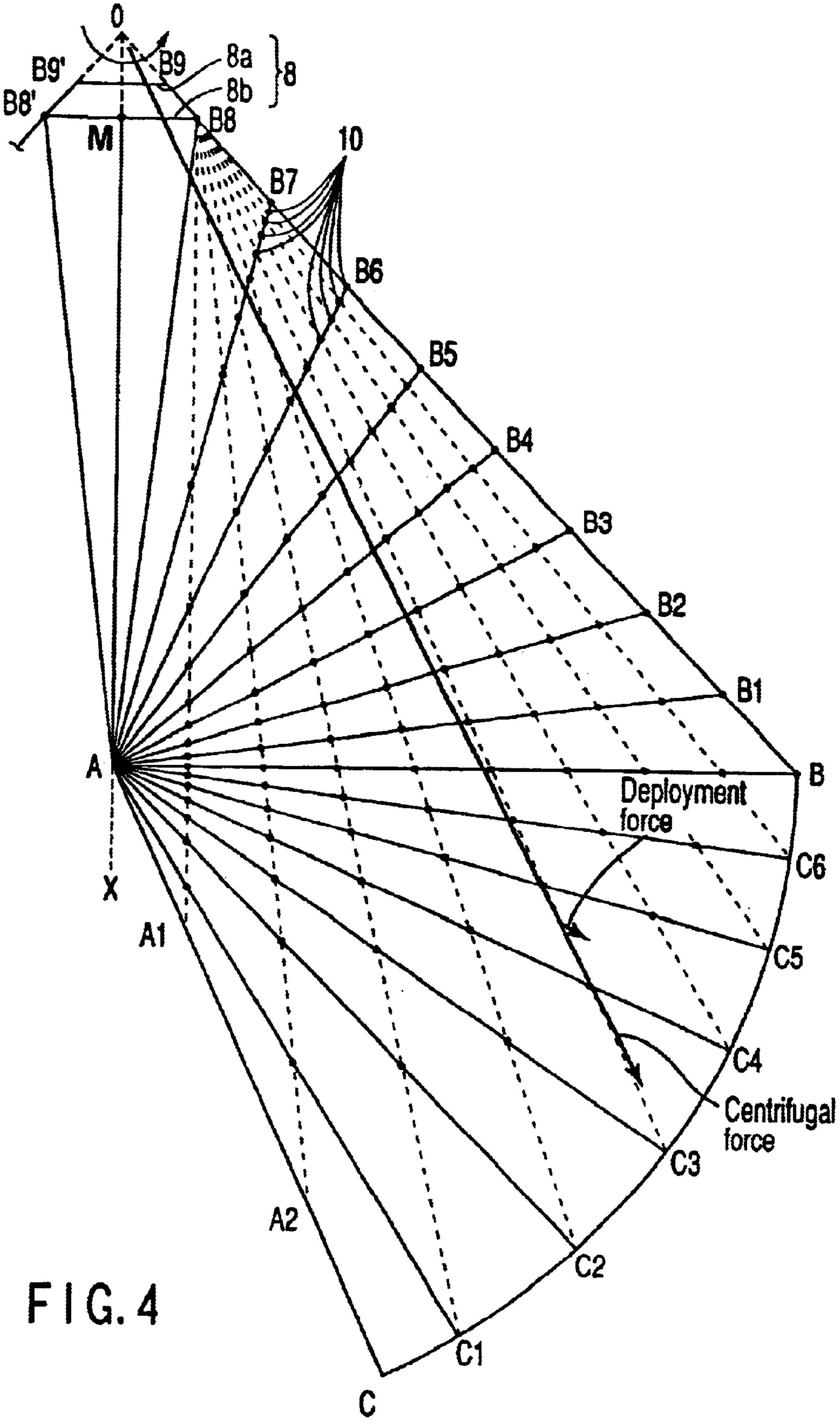
FIG. 4 is a schematic diagram showing a modification of the petal shown in FIG. 3.
Figure 6:
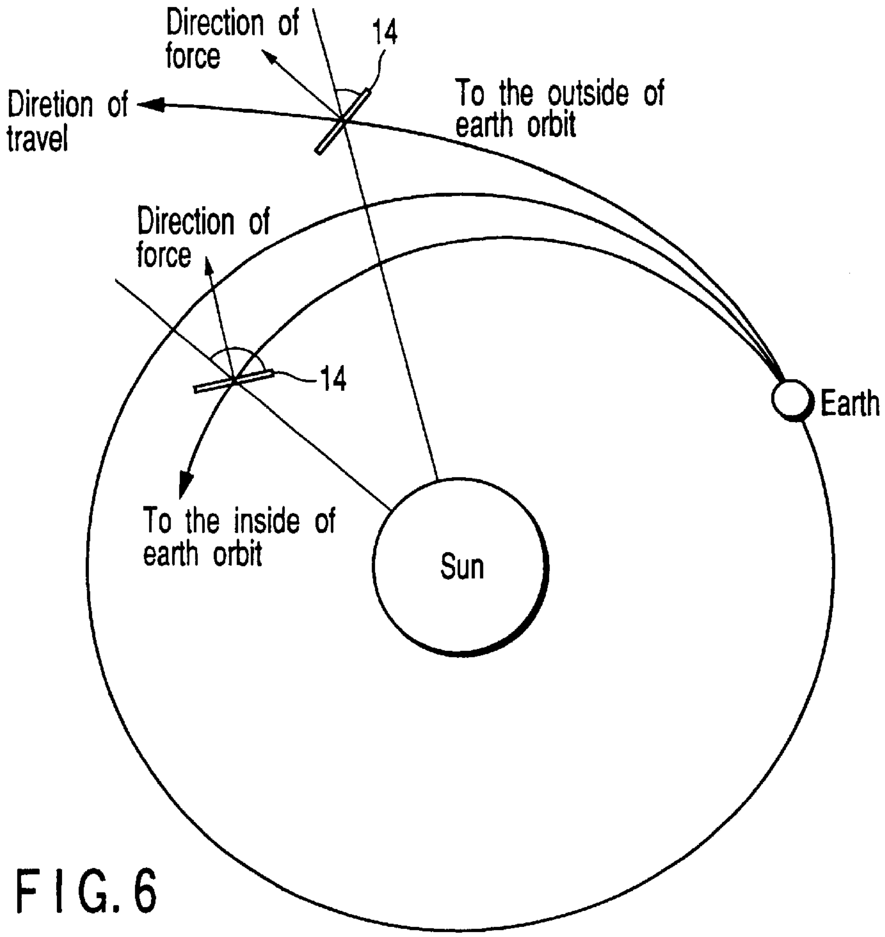
FIG. 6 is a schematic diagram showing an orbit of a spacecraft traveled by a large membrane space structure.
Figure 7:
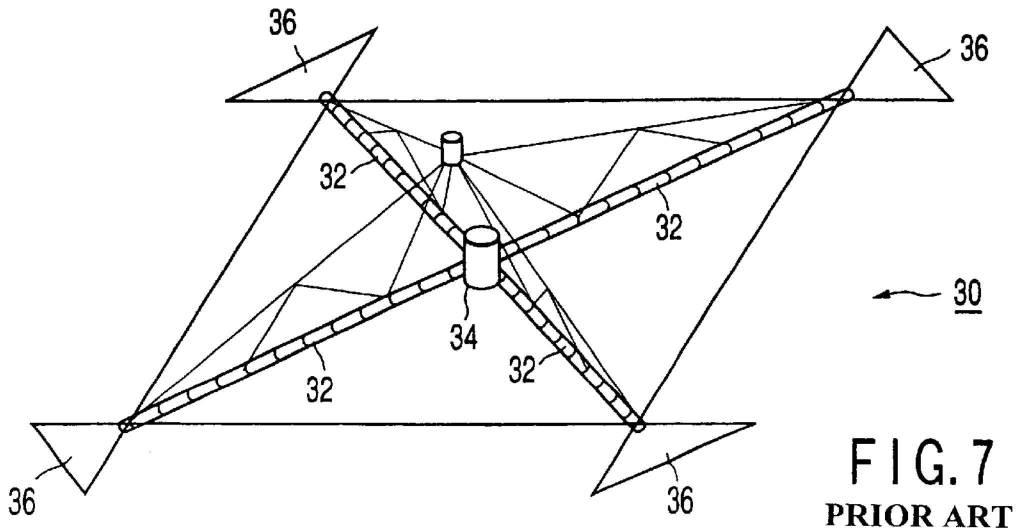
FIG. 7 PRIOR ART
FIG. 7 is a schematic diagram showing a quadrilateral large membrane space structure according to the conventional art.

Further, in this embodiment, the petal 6 is quadrilateral. However, the petal 6 is not limited to this shape but can be of any shape so long as it is symmetric with respect to the imaginary center line OX. For example, it can be a triangle, a pentagon, or a polygon a side of which is arc-shaped (see FIG. 4). Furthermore, the petal 6 may be designed such that a point C shown in FIG. 4 is located on the imaginary center line OX. In this case, the petal 6 can be further expanded.

Moreover, according to this embodiment, the shape of the membrane (the second region) is a triangle. However, it may be, for example, a rectangle or a polygon a side of which is arc-shaped (see FIG. 4).

A modification of the petal shape will now be described with reference to FIG. 4. The petal is constituted by two polygonal parts symmetric with respect to the imaginary center line OX, as the petal 6 described above. One of the polygonal parts OACB has three sides CA, AO and OB and an arc BC. Split lines $AB_8$ to $AB_1$, AB, and $AC_6$ to $AC_1$ are imaginarily drawn from the second fulcrum A to opposite side OB and arc BC at suitable intervals. Membranes are adhered to the regions defined by the side OB, the arc BC and the split lines $AB_8$ to $AB_1$, AB, and $AC_6$ to $AC_1$.

Further, imaginary lines $B_8A_1$, $B_8A_2$, $B_8C_1$ to $B_8C_6$ are drawn from the third fulcrum $B_8$ to the opposite side CA and arc BC at suitable intervals. Bridge belts 10 are arranged at the intersections between the imaginary lines $B_8A_1$, $B_8A_2$, $B_8C_1$ to $B_8C_6$ and the membranes.

Peripheral weights (not shown) can be provided on the marginal portions AC and CB of the membranes $ACC_1$, $AC_1C_2$, . . . $AC_6B$.

According to the embodiment, the number of petals 6 is not limited to four, so long as the petals 6 can be arranged around the hub 2 on the same plane as shown in FIGS. 1 to 3.

Further, in the above embodiment, the first rigging $B_9B_8$ and the second rigging $B_8B$ are separate members. However, the first and second rigging $B_9B_8$ and $B_8B$ may be formed of single rigging $B_9B$ as a unitary member. If a unitary member is used in place of the first and second rigging, the sides $B_9B_8$ and $B_8B$ form a straight line. It is assumed that the intersection between the extensions of the lines $BB_8$ and $B'B_8$ is O' (not shown) in the case where the first rigging $B_9B_8$ and second rigging and $B_8B$ are separate members. In this case, when the petal 6 is entirely deployed, the angle $B_8O'B_8'$ will be the same as or smaller than the angle $B_8OB_8'$.

In this embodiment, the lengths of the sides AB, $AB_8$ and AC shown in FIGS. 2 to 4 may be the same or different from one another.

In the embodiment, the petals 6 are deployed in space by rotating the sail 4 at the speed of 4 rpm. However, the rotation speed is not limited thereto. It is preferable that a rotation speed be chosen in accordance with the design of the sail 4.

According to the embodiment, the petals 6 are not connected to one another. However, the petals may be connected to one another by, for example, rigging at some points.

In the above embodiment, the present invention is applied to a large membrane space structure as a propulsive system. However, if a solar cell module (panel) is used in place of the membrane, the present invention can be applied to a large solar cell membrane structure. The large solar cell membrane structure can be spread in the same manner as in the embodiment described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A large membrane space structure mounted on a spacecraft comprising:

a) a hub including:
   - a plurality of supports, with a first imaginary fulcrum at a center of the hub, a first support member which is stiff, a second support member which is a beam structure that may be hinged on at least a midpoint thereof, and first rigging connecting ends of the first and second support members as well as the hub; and
   - control means for deflecting the supports at an angle with respect to the spacecraft by rotating the supports about an imaginary center line extending through the first imaginary fulcrum and the midpoint of the second support member as a pivotal member; and b) a sail including petals that are symmetrical with respect to the first imaginary fulcrum when deployed and attached to the supports, each petal including:
   - membranes spanned on first regions symmetric with respect to the imaginary center line and including the first fulcrum, a second fulcrum located on the imaginary center line and separated from the first fulcrum, and two points symmetric with respect to the imaginary center line, the membranes spanned on second regions defined by a peripheral portion of the first region opposite to the second fulcrum and a plurality of split lines extending from the second fulcrum to the peripheral portion at arbitrary intervals; and
   - bridge belts along the split lines to the peripheral portion discretely connecting membrane elements to one another at intersections between split lines and a plurality of imaginary lines extending from an end of the second support member to an end portion of an outermost membrane element opposite to the first fulcrum, the bridge belts providing tension across the membranes.

2. A large membrane space structure according to claim 1, further comprising membranes spanned on regions defined by the imaginary center line and the split lines nearest to the imaginary center line.

3. A large membrane space structure according to claim 2, wherein the bridge belts are welded and adhered at positions between the membrane elements.

4. A large membrane space structure according to claim 2, wherein the bridge belts are welded to positions between the membrane elements.

5. A large membrane space structure according to claim 2, wherein the bridge belts are adhered at positions between the membrane elements.

6. A large membrane space structure according to claim 2, wherein the membrane elements and the bridge belts are formed of a polymeric material resistant to space environment.

7. A large membrane space structure according to claim 6, wherein the membranes and the bridge belts have specular surfaces.

8. A large membrane space structure according to claim 6, wherein the membranes have specular surfaces.

9. A large membrane space structure according to claim 6, wherein the bridge belts have specular surfaces.

10. A large membrane space structure according to claim 2, wherein the membrane elements are equipped with solar cell modules.

11. A large membrane space structure according to claim 2, wherein a petal has folds in the bridge belts and is folded such that adjacent membrane elements a faced each other.

12. A large membrane space structure according to claim 11, wherein a petal is wrapped and packed around the hub.

13. A large membrane space structure according to claim 1, wherein second rigging extends from the first fulcrum and forms the peripheral portion.

14. A large membrane space structure according to claim 13, wherein the petals are connected to each other on the second rigging.

15. A large membrane space structure according to claim 13, wherein the first rigging and the second rigging are integrally formed as a unitary member.

16. A large membrane space structure according to claim 1, wherein the peripheral portion and the end portion are equipped with peripheral weights that assist deployment to a spanned configuration from a state wrapped and packed around the hub.

17. A large membrane space structure according to claim 1, wherein the peripheral portion is equipped with peripheral weights that assist deployment to a spanned configuration from a state wrapped and packed around the hub.

18. A large membrane space structure according to claim 1, wherein the end portion is equipped with peripheral weights.

19. A method for deploying the large membrane space structure recited in claim 1, in which each petal has folds at the bridge belts, and which is folded such that adjacent membrane elements are faced each other, and is wrapped and packed around the hub, said method comprising:

rotating the petal in a direction about the center of the hub;

extending first the petal radially from the hub by centrifugal force generated in radial directions perpendicular to a direction of rotation of a petal, thereby unwrapping the membrane elements from the hub by tension generated in the radial directions while the membrane members are folded at bridge lines, and rotating the first and second support members and the petal about the imaginary center line at an angle; and unfolding the folds by tension acting on the bridge belts by the centrifugal force, and deployment force in a circumferential direction of the petal generated by both the centrifugal force and tension supporting lines extending from the end of the second support member at angles with respect to a radial direction of the centrifugal force, thereby deploying the membrane elements.

20. A method for deploying the large membrane space structure according to claim 19, further comprising tilting the first and second support members and a petal about the imaginary center line, thereby controlling an amount of torque generated in the petal.

* * * * *